US012593400B2

(12) United States Patent
Furutani

(10) Patent No.: US 12,593,400 B2
(45) Date of Patent: Mar. 31, 2026

(54) WIRING SUBSTRATE

(71) Applicant: IBIDEN CO., LTD., Ogaki (JP)

(72) Inventor: Toshiki Furutani, Ibi-gun (JP)

(73) Assignee: IBIDEN CO., LTD., Ogaki (JP)

( * ) Notice: Subject to any disclaimer, the term of this patent is extended or adjusted under 35 U.S.C. 154(b) by 189 days.

(21) Appl. No.: 18/343,781

(22) Filed: Jun. 29, 2023

(65) Prior Publication Data

US 2024/0008176 A1    Jan. 4, 2024

(30) Foreign Application Priority Data

Jul. 1, 2022    (JP) ................................. 2022-107363

(51) Int. Cl.
H05K 1/02    (2006.01)
(52) U.S. Cl.
CPC ......... H05K 1/0298 (2013.01); H05K 1/0271 (2013.01); H05K 1/0296 (2013.01)
(58) Field of Classification Search
CPC .. H05K 1/0298; H05K 1/0271; H05K 1/0296; H05K 1/03; H01L 23/5383; H01L 23/49822
See application file for complete search history.

(56) References Cited

U.S. PATENT DOCUMENTS

| | | | | | |
|---|---|---|---|---|---|
| 2015/0327363 | A1* | 11/2015 | Inagaki | ................ | H05K 1/0313 |
| | | | | | 174/251 |
| 2020/0083179 | A1* | 3/2020 | Lee | ..................... | H01L 23/5384 |
| 2022/0132664 | A1* | 4/2022 | Shin | ..................... | H05K 3/4682 |
| 2022/0157730 | A1* | 5/2022 | Jang | ..................... | H05K 3/4694 |
| 2022/0199538 | A1* | 6/2022 | Lu | ..................... | H01L 23/49822 |
| 2024/0422900 | A1* | 12/2024 | Shimizu | .................. | H05K 1/09 |

FOREIGN PATENT DOCUMENTS

JP    2014-225631 A    12/2014

* cited by examiner

*Primary Examiner* — Steven T Sawyer
(74) *Attorney, Agent, or Firm* — Finnegan, Henderson, Farabow, Garrett & Dunner, LLP

(57) ABSTRACT

A wiring substrate includes a core substrate, a first build-up part formed on a first surface of the substrate and including insulating layers and conductor layers, and a second build-up part formed on a second surface of the substate on the opposite side with respect to the first surface and including insulating layers and conductor layers. The first build-up part includes a first region and a second region such that a distance between adjacent conductor layers in the second region is smaller than a distance between adjacent conductor layers in the first region, the conductor layers in the second region include second wirings having the minimum wiring width and the minimum inter-wiring distance that are smaller than the minimum wiring width and the minimum inter-wiring distance of first wirings of the conductor layers in the first region and the insulating layers are continuous in the first region and second region.

20 Claims, 6 Drawing Sheets

FIG. 1

WIRING SUBSTRATE

CROSS-REFERENCE TO RELATED APPLICATIONS

The present application is based upon and claims the benefit of priority to Japanese Patent Application No. 2022-107363, filed Jul. 1, 2022, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2014-225631 describes a wiring substrate that includes: a first wiring member in which insulating layers and wiring layers are symmetrically laminated on both sides of a core layer; a second wiring member that is a high-density wiring layer laminated on one side of the first wiring member; and an outermost insulating layer that is a solder resist layer laminated on the other side of the first wiring member. The entire contents of this publication are incorporated herein by reference.

SUMMARY OF THE INVENTION

According to one aspect of the present invention, a wiring substrate includes a core substrate, a first build-up part formed on a first surface of the core substrate and including insulating layers and conductor layers, and a second build-up part formed on a second surface of the core substate on the opposite side with respect to the first surface and including insulating layers and conductor layers. The first build-up part includes a first region and a second region such that a distance between adjacent conductor layers in the second region is smaller than a distance between adjacent conductor layers in the first region, the conductor layers in the second region include second wirings having the minimum wiring width and the minimum inter-wiring distance that are smaller than the minimum wiring width and the minimum inter-wiring distance of first wirings of the conductor layers in the first region, respectively, and the insulating layers are continuous in the first region and second region.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a cross-sectional view illustrating an example of a wiring substrate according to an embodiment of the present invention;

DETAILED DESCRIPTION OF THE EMBODIMENTS

Figure 2:
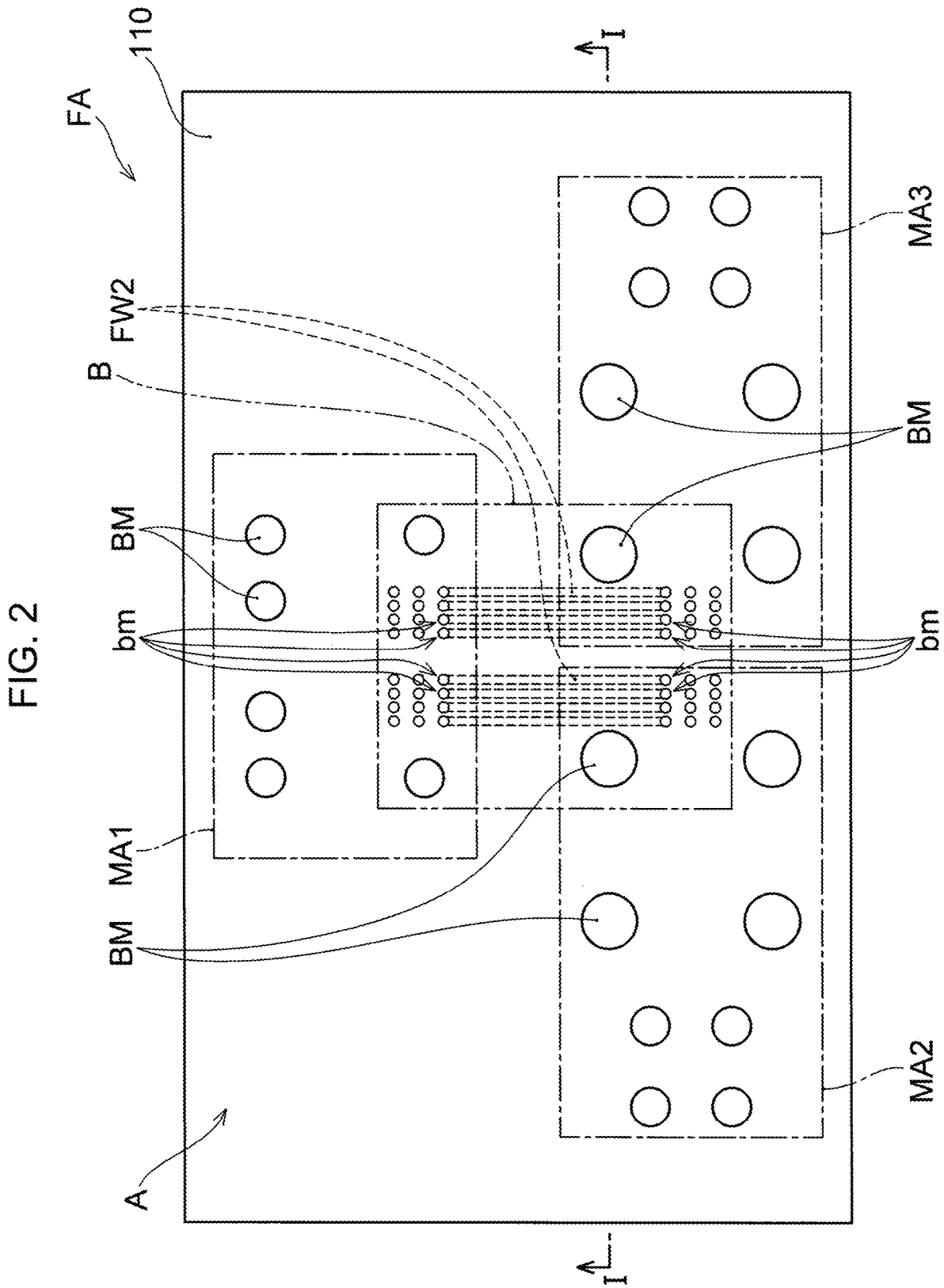
FIG. 2 is a plan view illustrating an example of a wiring substrate according to an embodiment of the present invention.

Embodiments will now be described with reference to the accompanying drawings, wherein like reference numerals designate corresponding or identical elements throughout the various drawings.

Figure 1:
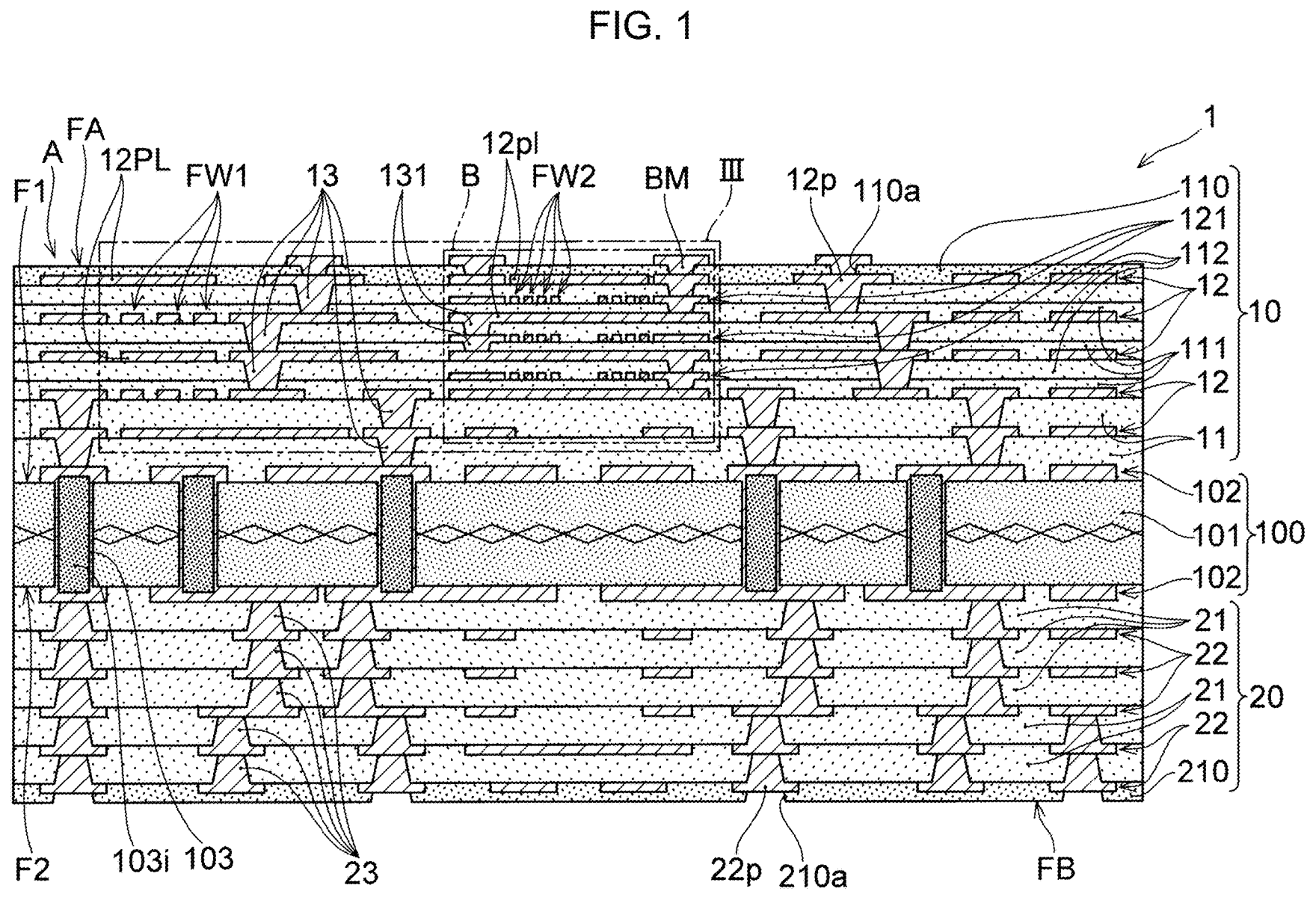

FIG. 1 illustrates a cross-sectional view of a wiring substrate 1 as an example of a wiring substrate according to an embodiment of the present invention. As illustrated in FIG. 1, the wiring substrate 1 includes a core substrate 100 that includes an insulating layer (core insulating layer) 101 and conductor layers (core conductor layers) 102 that are respectively formed on both sides of the core insulating layer 101. In the insulating layer 101 of the core substrate 100, through-hole conductors 103 are formed connecting the conductor layer 102 that forms a first surface (F1) of the core substrate 100 and the conductor layer 102 that forms a second surface (F2) of the core substrate 100. Inner sides of the through-hole conductors 103 are each filled with a resin body (103*i*) containing an epoxy resin or the like.

Insulating layers and conductor layers are alternately laminated on the first surface (F1) and the second surface (F2) of the core substrate 100. In the illustrated example, a first build-up part 10 in which insulating layers (11, 111, 112) and conductor layers (12, 121) are laminated is formed on the first surface (F1) of the core substrate 100. A second build-up part 20 in which insulating layers 21 and conductor layers 22 are laminated is formed on the second surface (F2) of the core substrate 100.

In the description of the wiring substrate of the present embodiment, a side farther from the core insulating layer 101 is referred to as "upper," "upper side," "outer side," or "outer," and a side closer to the core insulating layer 101 is referred to as "lower," "lower side," "inner side," or "inner." Further, for the insulating layers and the conductor layers, a surface facing the opposite side with respect to the core substrate 100 is also referred to as an "upper surface," and a surface facing the core substrate 100 side is also referred to as a "lower surface." Therefore, for example, in the description of the structural elements of the first build-up part 10 and the second build-up part 20, a side farther from the core substrate 100 is also referred to as an "upper side," "upper-layer side," or "outer side," or simply "upper" or "outer," and a side closer to the core substrate 100 is also referred to as a "lower side," "lower-layer side," or "inner side," or simply "lower" or "inner."

The first build-up part 10 includes a second region (B) surrounded by a two-dot chain line in the illustration, and a first region (A), which is a region other than the second region (B) in the first build-up part 10. The first region (A) is formed of the insulating layers (11, 111, 112) and the conductor layers 12 that are respectively formed in contact with the upper surfaces of the insulating layers (11, 112). The second region (B) is formed of the insulating layers (111, 112), the conductor layers 121 that are respectively formed in contact with the upper surfaces of the insulating layers 111, and the conductor layers 12 that are respectively formed in contact with the upper surfaces of the insulating layers 112 or the insulating layers 11.

The second region (B) is a region that occupies a part of the first build-up part 10 in a thickness direction and a part of the first build-up part 10 in a planar direction (perpendicular to the thickness direction). The second region (B) in the first build-up part 10 differs from the first region (A) in that it has conductor layers 121 that are respectively in contact with the upper surfaces of the insulating layers 111. In the illustration, the side surface of the second region (B), which is defined by the virtual two-dot chain line, extending in the thickness direction of the first build-up part 10 serves as a boundary between the second region (B) and the first region (A) in a lateral direction (extension direction of the insulating layers 111).

In the example illustrated in FIG. 1, the second region (B) is a region that occupies a portion of the first build-up part 10 on a side farther from the core substrate 100 in the thickness direction, and the lower surface of the lowermost conductor layer 12 of the second region (B) defines a part of the boundary between the second region (B) and the first region (A). Further, in the illustrated example, the outermost surface of the second region (B) forms a part of a surface (FA) on one side of the wiring substrate 1, which is the outermost surface of the first build-up part 10.

As described above, the conductor layers 12 in the first region (A) are respectively formed in contact with the upper surfaces of the insulating layers 11 or the insulating layers 112, and in particular, no conductor layers are formed on the insulating layers 111 among the insulating layers (111, 112), which are each interposed between two adjacent conductor layers 12. On the other hand, in the second region (B), the conductor layers 12 are respectively formed on the insulating layers 112, which is similar to that in the first region (A), and the conductor layers 121 are respectively formed on the insulating layers 111. In other words, in the second region (B), one insulating layer 111 or one insulating layer 112 is interposed between two adjacent conductor layers (121, 12), and in the first region (A), two insulating layers (one insulating layer 111 and one insulating layer 112) are interposed between two adjacent conductor layers 12. That is, a distance between adjacent conductor layers in the second region (B) is different from a distance between adjacent conductor layers in the first region (A), and the distance between adjacent conductor layers (a conductor layer 121 and a conductor layer 12) in the second region (B) is smaller than the distance between adjacent conductor layers (conductor layers 12) in the first region (A). The insulating layers (111, 112) forming the first build-up part 10 each have a thickness smaller than a thickness of each of the insulating layers 11, which are each interposed as a single layer between two conductor layers 12.

In the wiring substrate of the embodiment, in the first build-up part 10, the insulating layers (111, 112) forming the first region (A) and the insulating layers (111, 112) forming the second region (B) are continuous without interruption. On the upper surfaces of the insulating layers 111, which each continuously extend from the first region (A) to the second region (B), the conductor layers 121 are respectively formed in the second region (B) and no conductor layers are formed in the first region (A). On the upper surfaces of the insulating layers 112, which each continuously extend from the first region (A) to the second region (B), the conductor layers 12 are respectively formed in both the second region (B) and the first region (A).

In the first region (A) of the first build-up part 10, via conductors 13 are formed that each penetrate an insulating layer 11 and connect conductor layers (102, 12) in contact with the insulating layer 11. In the illustrated example, in a portion of the first region (A) where the insulating layers (111, 112) are laminated, via conductors 13 are formed that each contiguously penetrate an insulating layer 111 and an insulating layer 112 and connect adjacent conductor layers 12. Further, in the second region (B), via conductors 131 are formed that each penetrate an insulating layer 111 or an insulating layer 112 and connect a conductor layer 121 and a conductor layer 12 that are adjacent to each other. In the second build-up part 20, via conductors 23 are formed that each penetrate an insulating layer 21 and connect conductor layers (22, 102) that are respectively in contact with the upper side and the lower side of the insulating layer 21.

The first build-up part 10 includes, as an outermost insulating layer thereof, an insulating layer 110, which is, for example, a solder resist layer. The second build-up part 20 includes, as an outermost insulating layer thereof, an insulating layer 210, which is, for example, a solder resist layer. Openings (110a) are formed in the insulating layer 110, and conductor pads (12p) of the outermost conductor layer 12 in the first build-up part 10 are exposed in the openings (110a). In the illustrated example, on the conductor pads (12p) exposed in the openings (110a), connection elements (BM) are formed, which can be conductor posts for connection to an external electronic component that can be mounted on the wiring substrate 1. Openings (210a) are formed in the insulating layer 210, and conductor pads (22p) of the outermost conductor layer 22 in the second build-up part 20 are exposed in the openings (210a).

The wiring substrate 1 has, as two surfaces that extend in a direction orthogonal to the thickness direction of the wiring substrate 1, a surface (FA) on one side and a surface (FB) on the opposite side with respect to the surface (FA). The surface (FA) as an outermost surface of the first build-up part 10 is formed by exposed surfaces of the connection elements (BM) and the insulating layer 110. The surface (FB) as an outermost surface of the wiring substrate 1 on the opposite side with respect to the surface (FA) is formed by exposed surfaces of the insulating layer 210 and the outermost conductor layer 22 (the conductor pads (22p)).

The surface (FA) can be structured as a component mounting surface on which an external electronic component can be mounted. Specifically, as will be described later with reference to FIG. 2, the surface (FA) can include connection elements forming multiple different component mounting regions, which can be connected to each other by wirings in the conductor layers 121 included in the second region (B). Electrodes of an external electronic component can be electrically and mechanically connected to the connection elements (BM) exposed on the surface (FA), for example, via a bonding material (not illustrated in the drawings) such as solder. Examples of components that can be mounted on the wiring substrate 1 include electronic components such as active components such as semiconductor integrated circuit devices and transistors.

The surface (FB) on the opposite side with respect to the surface (FA) of the wiring substrate 1 in the example of FIG. 1 can be a connection surface to be connected to an external element such as an external wiring substrate, for example, a motherboard of any electrical device, when the wiring substrate 1 itself is mounted on the external element. Further, similarly to the surface (FA), the surface (FB) may be a component mounting surface on which an electronic component such as a semiconductor integrated circuit device is mounted. Without being limited to these, the conductor pads (22$p$) forming the surface (FB) can be connected to any substrate, electrical component, mechanism element, or the like.

The insulating layers (101, 11, 111, 112, 21) among the insulating layers forming the wiring substrate 1 can each be formed using an insulating resin. Examples of the insulating resin include: thermosetting resins such as epoxy resins, bismaleimide triazine resins (BT resins), or phenolic resins; and thermoplastic resins such as fluorine resins, liquid crystal polymers (LCP), fluoroethylene (PTFE) resins, polyester (PE) resins, and modified polyimide (MPI) resins. The insulating layers may contain the same insulating resin or may contain different insulating resins from each other. For example, the insulating layers (110, 210), which are solder resist layers, can be formed using, for example, a photosensitive epoxy resin or polyimide resin, or the like. The insulating layers (101, 11, 111, 112, 21, 110, 210) can each contain an inorganic filler such as silica, or alumina. The insulating layers (101, 11, 111, 21) may each also contain a reinforcing material (core material) such as a glass fiber.

The conductor layers (102, 12, 121, 22), the via conductors (13, 131, 23), and the through-hole conductors 103, which form the wiring substrate 1, are formed using any metal such as copper or nickel, and, for example, are each formed of a metal foil such as a copper foil and/or a metal film formed by plating or sputtering or the like. The conductor layers (102, 12, 121, 22), the via conductors (13, 131, 23), and the through-hole conductors 103 are each illustrated in FIG. 1 as having a single-layer structure, but can each have a multilayer structure that includes two or more metal layers. For example, the conductor layers 102 that are respectively formed on the surfaces of the insulating layer 101 can each have a five-layer structure including a metal foil layer (preferably, a copper foil), a metal film layer (preferably a copper film formed by electroless plating or sputtering), and an electrolytic plating film layer (preferably, an electrolytic copper plating film). Further, the conductor layers (12, 121, 22), the via conductors (13, 131, 23), and the through-hole conductors 103 can each have a two-layer structure including, for example, a metal film layer and an electrolytic plating film layer.

The conductor layers (102, 12, 121, 22) of the wiring substrate 1 are each be patterned to have predetermined conductor patterns. In particular, the conductor layers 12 included in the first region (A) include first wirings (FW1), and the conductor layers 121 included in the second region (B) include second wirings (FW2) of which a minimum wiring width and a minimum inter-wiring distance are respectively smaller than a minimum wiring width and a minimum inter-wiring distance of the first wirings (FW1).

As illustrated, in the first region (A), for each of the conductor layers 12 that include the first wirings (FW1), a conductor layer 12 on a one-layer upper side and a conductor layer 12 on a one-layer lower side each have a plane layer (12PL) at a position overlapping the first wirings (FW1) in a plan view. Further, in the second region (B), for each of the conductor layers 121 that include the second wirings (FW2), a conductor layer 12 on a one-layer upper side and a conductor layer 12 on a one-layer lower side each have a plane layer (12$pl$) at a position overlapping the second wirings (FW2) in a plan view. The term "in a plan view" means viewing an object along the thickness direction of the wiring substrate 1.

In this embodiment, the wiring substrate 1 includes the second build-up part 20 on the second surface (F2) side of the core substrate 100. From a point of view of suppressing warping of the wiring substrate 1, the thickness of the second build-up part 20 may be adjusted according to the thickness of the first build-up part 10. As in the illustrated example, the thickness of the second build-up part 20 may be about the same as the thickness of the first build-up part 10. In the wiring substrate of the embodiment, the first build-up part 10 includes, as a part thereof, the second region (B) where a distance between adjacent conductor layers is small. The second region (B) includes finer wirings (the second wirings (FW2)) compared to wirings (the first wirings (FW1)) included in a region (the first region (A)) other than the second region (B) in the first build-up part 10. Further, in the wiring substrate of the embodiment, the insulating layers (111, 112) included in the second region (B) are continuous with the insulating layers (111, 112) included in the first region (A). That is, a region having relatively fine wirings is realized by being embedded in the first build-up part 10. That is, in the wiring substrate of the embodiment, a region having relatively fine wirings is realized in the first build-up part while an increase in thickness due to further laminating additional insulating layers and conductor layers on an outer side of the first build-up part 10 is suppressed.

Therefore, in the wiring substrate of the embodiment, an increase in thickness of the second build-up part along with an increase in thickness of the first build-up part 10 can also be suppressed. Therefore, in the wiring substrate, warping can be effectively suppressed while an increase in dimension in the thickness direction is suppressed.

As illustrated, the number of the conductor layers 22 forming the second build-up part 20 can be made equal to the number of the conductor layers 12 forming the first region (A) of the first build-up part 10. It is thought that warping due to a difference in thermal expansion amount between structural elements on both sides of the core substrate 100 of the wiring substrate 1 can be further effectively suppressed.

Next, the structure of the first build-up part 10 is described in detail with reference to FIG. 2, which is a plan view when the wiring substrate 1 is viewed from an outer side of the surface (FA). As illustrated, the surface (FA) as the outermost surface of the first build-up part 10 is formed of the insulating layer 110 and multiple connection elements (BM, bm) exposed from the insulating layer 110. The surface (FA) can have multiple component mounting regions (MA1, MA2, MA3). The multiple component mounting regions (MA1, MA2, MA3) are each a region where one external electronic component can be mounted when the wiring substrate 1 is used. The cross-sectional view illustrated in FIG. 1 is a cross-sectional view taken along an I-I line in FIG. 2.

The component mounting region (MA1) is referred to as a first component mounting region (MA1), the component mounting region (MA2) is referred to as a second component mounting region (MA2), and the component mounting region (MA3) is referred to as a third component mounting region (MA3), which are each surrounded by a one-dot chain line in the plan view of FIG. 2. In the illustrated example, the first, second, and third component mounting regions (MA1, MA2, MA3) each include multiple connection elements (BM, bm).

As illustrated, among the multiple component mounting regions (MA1, MA2, MA3) included in the surface (FA), two component mounting regions can be connected to each other by the second wirings (FW2) included in the second region (B) described with reference to FIG. 1. That is, the second wirings (FW2) included in the second region (B) include so-called bridge wirings that connect connection elements forming different component mounting regions among the multiple component mounting regions included in the surface (FA).

In FIG. 2, the second region (B) is illustrated as a region surrounded by a two-dot chain line, and the outermost second wirings (FW2) included in the second region (B) are indicated using dashed lines. As illustrated, the connection elements (bm) included in the first component mounting region (MA1) and the connection elements (bm) included in the second component mounting region (MA2) or the connection elements (bm) included in the third component mounting region (MA3) are connected by the second wirings (FW2). The second wirings (FW2) indicated by dashed lines are connected to the connection elements (bm) by via conductors (not illustrated) formed directly below the connection elements (bm). The connection elements (bm) that are not connected by the second wirings (FW2) indicated by the dashed lines in FIG. 2 can be connected to the connection elements (bm) of different component mounting regions by the second wirings (FW2) that are included in the second region (B) but are not illustrated in FIG. 2.

Figure 3:
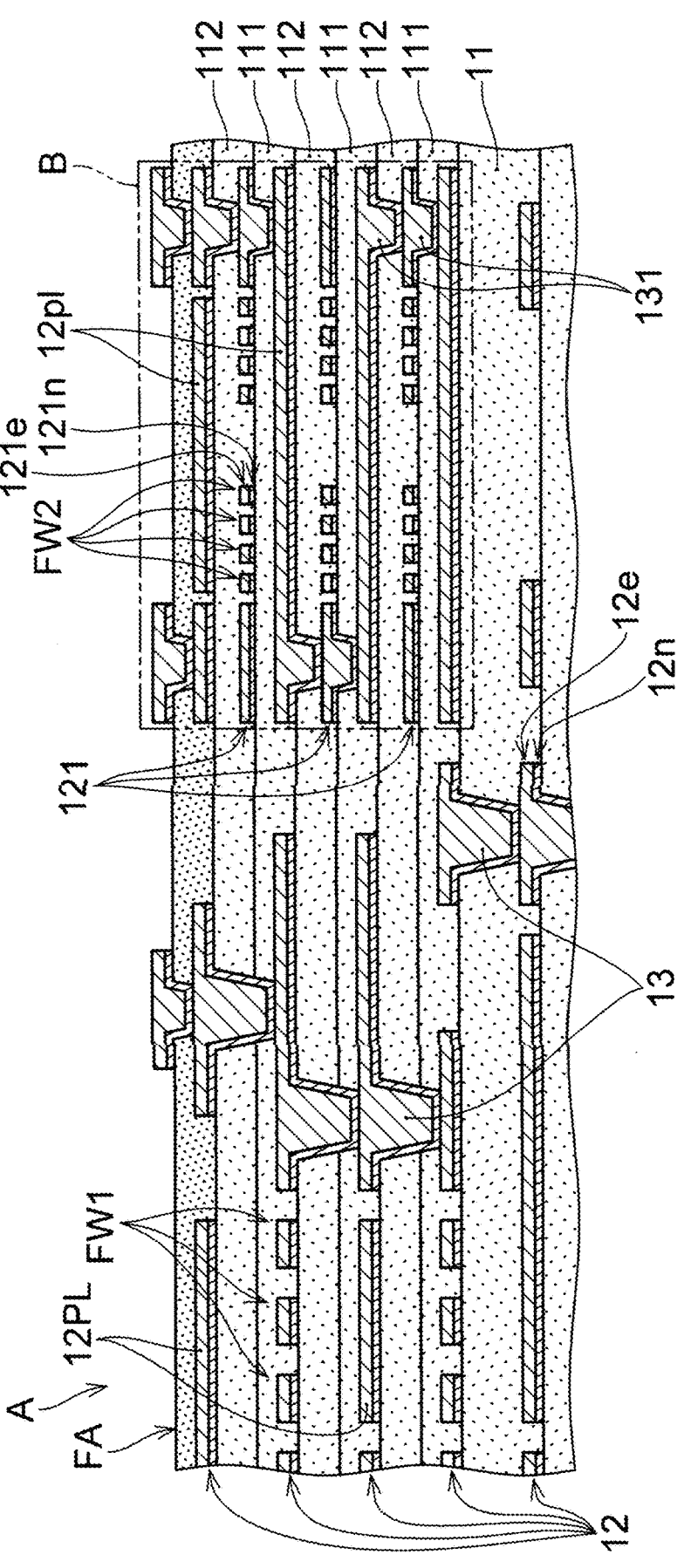
FIG. 3 is a partial enlarged view of FIG. 1, which illustrates an example of a wiring substrate according to an embodiment of the present invention.

Next, with reference to FIG. 3, which is an enlarged view of a region containing the second wirings (FW2) and the first wirings (FW1) included in the first build-up part 10 of the wiring substrate 1, structures of the conductor layers (12, 121) included in the first build-up part 10 are described in detail FIG. 3 is an enlarged view of a region (III) surrounded by a one-dot chain line in FIG. 1. As illustrated in FIG. 3, the conductor layers 12, the via conductors 13, and the via conductors 131 that each penetrate an insulating layer 112 are each formed of two layers including a metal film layer (12n) and an electrolytic plating film layer (12e), and the conductor layers 121 and the via conductor 131 that each penetrate an insulating layer 111 are each formed of two layers including a metal film layer (121n) and an electrolytic plating film layer (121e). The metal film layers (12n, 121n) are layers that can function as power feeding layers when the electrolytic plating film layers (12e, 121e) are formed, and can be sputtering film layers formed by sputtering.

As described above, the distance between adjacent conductor layers (12, 121) among the multiple conductor layers (12, 121) included in the second region (B) is smaller than the distance between adjacent conductor layers 12 among the multiple conductor layers 12 in the first region (A). For example, the insulating layer 11 that is included in the first region (A) and is interposed as a single layer between adjacent conductor layers 12 can be formed to have a thickness of about 10 μm-30 μm. The insulating layers 111 that continuously extend from the first region (A) to the second region (B) can be formed to each have a thickness of, for example, about 5 μm-15 μm, and the insulating layers 112 can be formed to each have a thickness of about 5 μm-15 μm.

The conductor layers 12 that are respectively formed in contact with the upper surfaces of the insulating layers (11, 112) can be formed to each have a conductor thickness of, for example, 7 μm or more and 20 μm or less. The conductor layers 121 that are respectively formed in contact with the upper surfaces of the insulating layers 111 are formed to each have a conductor thickness smaller than the conductor thickness of each of the conductor layers 12, and can be formed to each have a conductor thickness of, for example, 3 μm or more and 15 μm or less. As described above, the conductor layers 12 include the first wirings (FW1) in the first region (A), and the conductor layers 121 include, in the second region (B), the second wirings (FW2) having smaller wiring widths and inter-wiring distances than the wiring widths and inter-wiring distances of the first wirings (FW1). Specifically, for example, for the first wirings (FW1), the minimum wiring width is 5 μm or less and the minimum inter-wiring distance is 7 μm or less, and for the second wirings (FW2), the minimum wiring width is 3 μm or less and the minimum inter-wiring distance is 5 μm or less.

The first wirings (FW1) and the second wirings (FW2) are formed to have aspect ratios in a predetermined range. For example, the first wirings (FW1) and the second wirings (FW2) can be formed to have aspect ratios in a range of 2.0 or more and 4.0 or less. Specifically, as will be described later in the method for manufacturing the wiring substrate, the upper surfaces of the first wirings (FW1) and the second wirings (FW2) are polished during manufacturing. Therefore, the upper surfaces of the first wirings (FW1) and the second wirings (FW2) can be relatively flat polished surfaces having an arithmetic mean roughness (Ra) of 0.3 μm or less.

The conductor layers 12 adjacent to the upper side and lower side of the second wirings (FW2) included in the second region (B) have plane layers (12pl) that overlap the second wirings (FW2) in a plan view. The plane layers (12pl) are so-called solid patterns that extend over a region overlapping the second wirings (FW2) in the planar direction (extension direction of the upper surfaces of the insulating layers 112). The plane layers (12pl) can be used as ground patterns or power patterns. In the second region (B), it may be possible that transmission quality of signals carried by the second wirings (FW2) is improved by having the structure in which the plane layers (12pl) are positioned directly above and directly below the second wirings (FW2). Since the second wirings (FW2) overlap the plane layers (12pl) both on an upper-layer side and on a lower-layer side, it is thought that the second wirings (FW2) are less susceptible to external noise interference and good signal transmission can be enabled. Also, in the illustrated example, in the first region (A), the conductor layers 12 adjacent to the upper side and lower side of the first wirings (FW1) have plane layers (12PL) that overlap the first wirings (FW1) in a plan view. It is thought that relatively good signal transmission can be realized also by the first wirings (FW1).

Figure 4A:
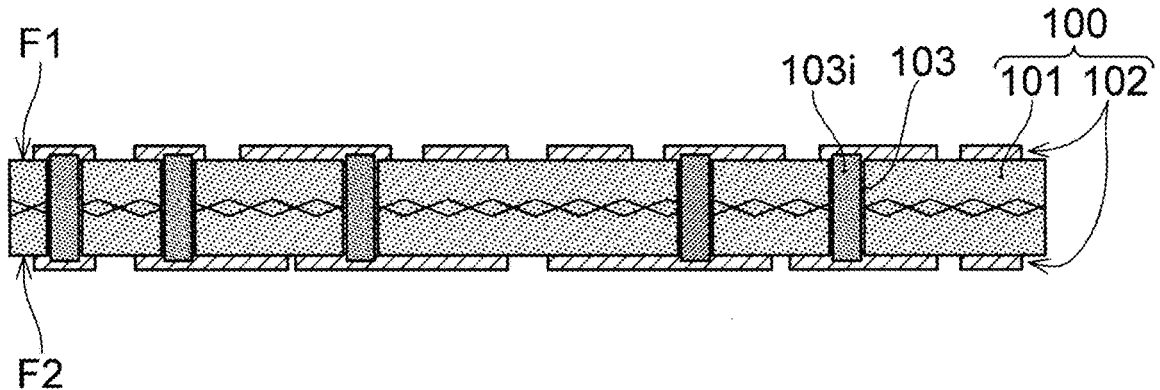
FIG. 4A is a cross-sectional view illustrating a method for manufacturing a wiring substrate according to an embodiment of the present invention.

Next, with reference to FIGS. 4A-4H, a method for manufacturing a wiring substrate, which is an embodiment, is described using a case where the wiring substrate 1 illustrated in FIG. 1 is manufactured as an example. First, as illustrated in FIG. 4A, the core substrate 100 is prepared.

In preparing the core substrate 100, for example, a double-sided copper-clad laminate is prepared in which a metal foil is provided on surfaces of the core insulating layer 101. Through holes are formed in the double-sided copper-clad laminate, for example, by drilling. For example, an electroless plating film layer is formed on inner walls of the through holes and on the upper surface of the metal foil, and an electrolytic plating film layer is formed on the electroless plating film layer using the electroless plating film layer as a power feeding layer. As a result, although illustrated as having a single-layer structure in the drawings, the through-hole conductors 103 are formed that have a two-layer structure including the electroless plating film layer and the electrolytic plating film layer and cover the inner walls of the through holes.

The inner sides of the through-hole conductors 103 are filled with the resin bodies (103*i*) by injecting, for example, an epoxy resin into the inner sides of the through-hole conductors 103. After the filling resin bodies (103*i*) are solidified, on the resin bodies (103*i*) and the upper surface of the electrolytic plating film layer, an electroless plating film layer and an electrolytic plating film layer are further formed. As a result, although illustrated as each having a single-structure, the conductor layers 102 each having a five-layer structure including the metal foil layer, the electroless plating film layer, the electrolytic plating film layer, the electroless plating film layer, and the electrolytic plating film layer are respectively formed on both sides of the insulating layer 101. Then, the core substrate 100 having predetermined conductor patterns is obtained by patterning the conductor layers 102 using a subtractive method.

Figure 4B:
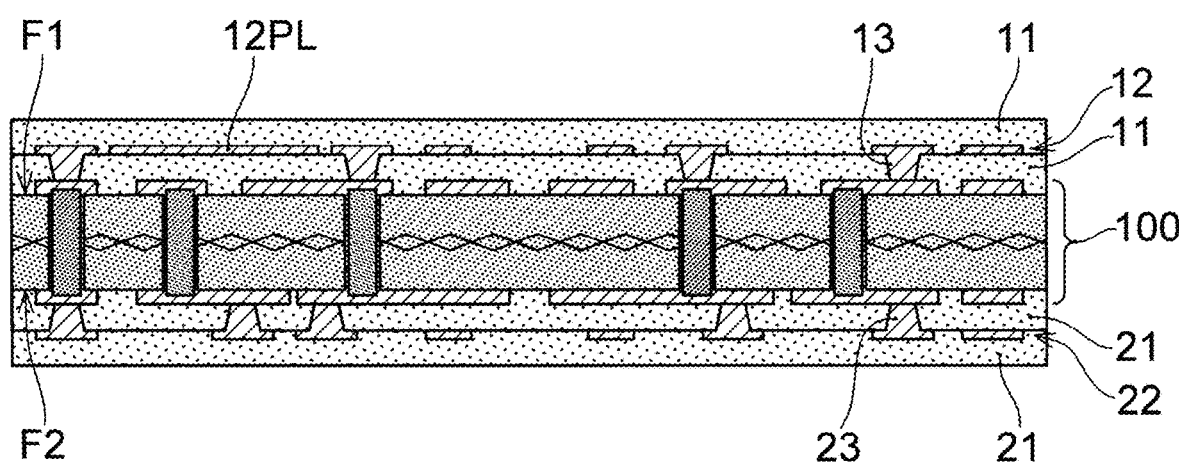
FIG. 4B is a cross-sectional view illustrating a method for manufacturing a wiring substrate according to an embodiment of the present invention.

Next, as illustrated in FIG. 4B, an insulating layer 11 is formed on the first surface (F1) of the core substrate 100, and a conductor layer 12 is laminated on the insulating layer 11. An insulating layer 21 is formed on the second surface (F2) of the core substrate 100, and a conductor layer 22 is laminated on the insulating layer 21. For example, the insulating layers (11, 21) are each formed by thermocompression bonding a film-like insulating resin onto the core substrate 100. The insulating layers (11, 21) can be formed to each have a thickness of, for example, about 10 μm-30 μm. The conductor layers (12, 22) are formed using any method for forming conductor patterns, such as a semi-additive method, at the same time as the via conductors (13, 23) filling openings that can be formed in the insulating layers (11, 21), for example, using laser.

For example, forming the conductor layers (12, 22) can include: forming a metal film layer covering the upper surfaces of the insulating layers (11, 21); and forming a plating resist (not illustrated) having openings according to conductor patterns to be formed on the metal film layer. The metal film layer can be formed, for example, by sputtering or electroless plating. Forming the conductor layers (12, 22) can further include: forming, on the metal film layer exposed from the openings of the plating resist and on the plating resist, an electrolytic plating film thicker than the plating resist using the metal film layer as a power feeding layer; and exposing the upper surface of the plating resist by removing a part of the electrolytic plating film in the thickness direction by polishing.

The polishing for removing a part of the electroplated film in the thickness direction can be performed, for example, by CMP polishing. After the plating resist is exposed, reducing the thickness of the electrolytic plating film and the thickness of the plating resist, and removing the resist and removing the metal film layer exposed by the removal by etching can be further performed. As illustrated, the conductor layer 12 formed on the first surface (F1) side of the core substrate 100 can be formed to have a conductor pattern including a plane layer (12PL), which is a solid pattern that spreads over a predetermined range in an extending direction of the upper surface of the insulating layer 11. On the formed conductor layer 12, an insulating layer 11 is further laminated, and on the conductor layer 22, an insulating layer 21 is further laminated, resulting in a state illustrated in FIG. 4B.

Figure 4C:
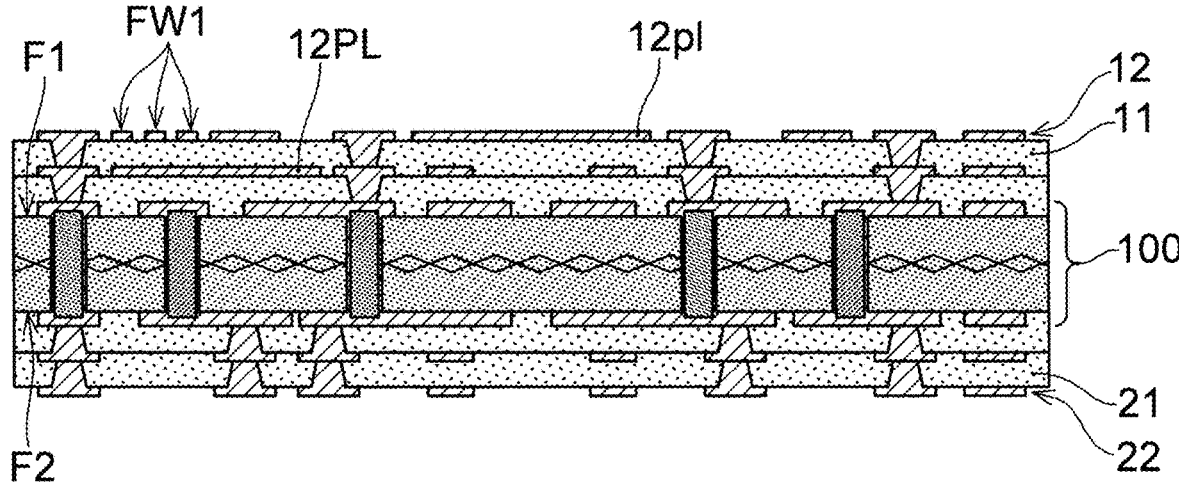
FIG. 4C is a cross-sectional view illustrating a method for manufacturing a wiring substrate according to an embodiment of the present invention.

Subsequently, as illustrated in FIG. 4C, on the first surface (F1) side of the core substrate 100, a conductor layer 12 including the lowermost plane layer (12*pl*) in the second region (B) (see FIG. 1) is formed on the insulating layer 11 using the same method as the formation of the conductor layers (12, 22) described above. Also on the second surface (F2) side of the core substrate 100, a conductor layer 22 can be formed on the insulating layer 21 using the same method as the formation of the conductor layers (12, 22) described above.

In the illustrated example, the conductor layer 12 including the lowermost plane layer (12*pl*) of the second region (B) is formed to include the first wirings (FW1) that form the first region (A) (see FIG. 1). As described above, the upper surface of the conductor layer 12 is a polished surface polished by, for example, CMP polishing. Therefore, the upper surfaces of the first wirings (FW1) can be formed as relatively flat surfaces with an arithmetic mean roughness (Ra) of 0.3 μm or less. The first wirings (FW1) can be formed at positions that overlap the plane layer (12PL) formed in the conductor layer 12 on the one-layer lower side in a plan view.

In the formation of the conductor layers 12 described with reference to FIGS. 4B and 4C, the conductor layers 12 can be formed to each have a thickness of, for example, 7 μm or more and 20 μm or less by adjusting the thickness of the plating resist and the degree of polishing. Further, also in further forming the upper-layer side conductor layers 12 to be described later with reference to FIGS. 4E and 4F, the conductor layers 12 can be formed to each have a similar thickness. The first wirings (FW1) formed in the conductor layers 12 can be formed to have a minimum wiring width of 5 μm or less, a minimum inter-wiring distance of 7 μm or less, and aspect ratios in a range of 2.0 or more and 4.0 or less.

Figure 4D:
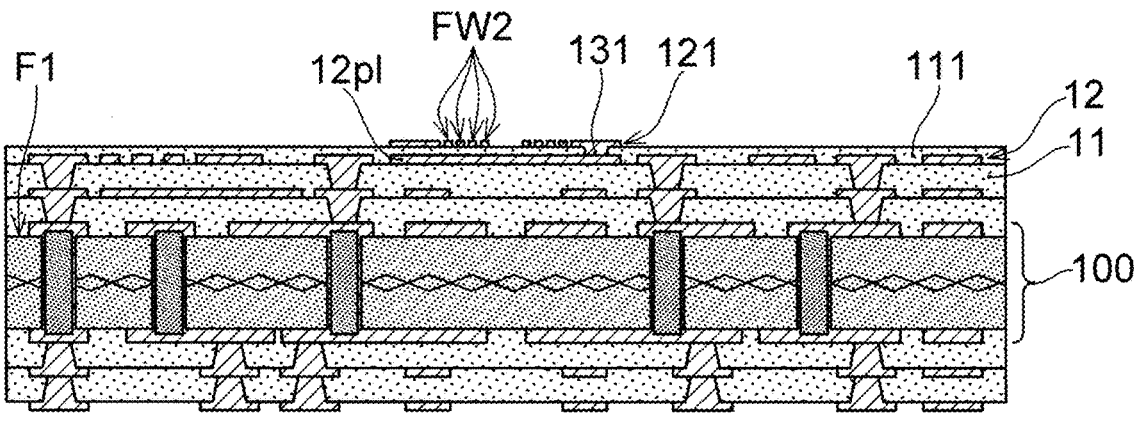
FIG. 4D is a cross-sectional view illustrating a method for manufacturing a wiring substrate according to an embodiment of the present invention.

Next, as illustrated in FIG. 4D, on the first surface (F1) side of the core substrate 100, an insulating layer 111 is laminated on the conductor layer 12, and a conductor layer 121 is integrally formed on the insulating layer 111 with via conductors 131 penetrating the insulating layer 111. Similar to the method of forming the conductor layers 12 described above, the conductor layer 121 can be formed using a method including forming a metal film layer, forming a plating resist on the metal film layer, forming an electrolytic plating film in resist openings, and polishing an upper surface of the electrolytic plating film.

The conductor layer 121 can be formed to have a conductor thickness smaller than the conductor thickness of each of the conductor layers 12, and can be formed to have a thickness of, for example, 3 μm or more and 15 μm or less by adjusting the thickness of the plating resist and the degree of polishing. The conductor layer 121 is formed to have second wirings (FW2) at positions that overlap the plane layer (12*pl*) formed in the conductor layer 12 on a one-layer lower side of the conductor layer 121 in a plan view. Similar to the upper surfaces of the conductor layers 12, the upper surface of the conductor layer 121 is a polished surface. Therefore, the upper surfaces of the second wirings (FW2) can be formed as relatively flat surfaces with, for example, an arithmetic mean roughness (Ra) of 0.3 μm or less.

The second wirings (FW2) can be formed to have a minimum wiring width of 3 μm or less, a minimum inter-wiring distance of 5 μm or less, and aspect ratios of 2.0 or more and 4.0 or less. After the formation of the conductor layer 12 and the conductor layer 22 illustrated in FIG. 4C and until completion of the formation of the first build-up part 10 illustrated in FIG. 4G, the exposed surfaces of the conductor layer 22 and the insulating layer 21 on the second surface (F2) side of the core substrate 100 can be appropriately protected using a mask such as a PET film.

Figure 4E:
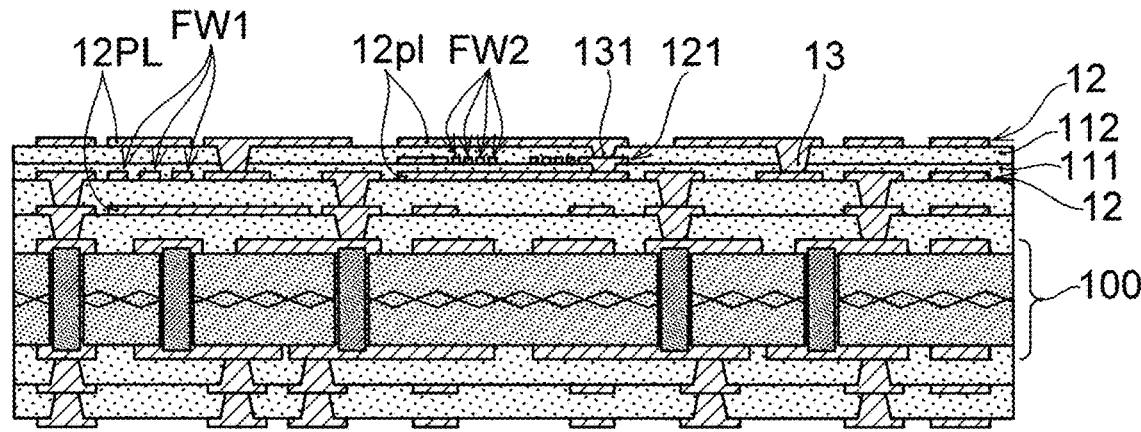
FIG. 4E is a cross-sectional view illustrating a method for manufacturing a wiring substrate according to an embodiment of the present invention.

Next, as illustrated in FIG. 4E, an insulating layer 112 is coated on the conductor layer 121 and on the insulating layer 111 exposed from the conductor patterns of the conductor layer 121. On the insulating layer 112, a conductor layer 12 can be integrally formed with via conductors 13 that continuously penetrate the insulating layer 112 and the insulating layer 111, and with via conductors 131 that penetrate the insulating layer 112, using the same method as the method for forming the conductor layers 12 described above. The conductor layer 12 as a conductor layer on a one-layer upper side of the conductor layer 121 including the second wirings (FW2), similar to the conductor layer 12 on a one-layer lower side of the conductor layer 121, can be formed to have a conductor pattern including a plane layer (12pl) that overlaps the second wirings (FW2) in a plan view. Further, as illustrated, when first wirings (FW1) are included in a conductor layer 12 adjacent to a conductor layer 12 to be formed, a plane layer (12PL) is formed at a position overlapping the first wirings (FW1) in a plan view.

Figure 4F:
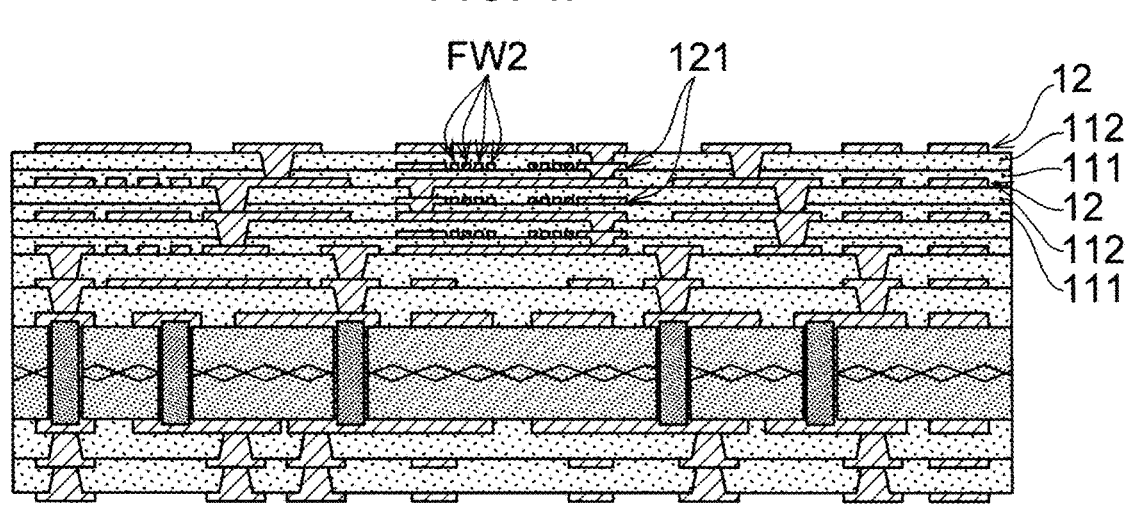
FIG. 4F is a cross-sectional view illustrating a method for manufacturing a wiring substrate according to an embodiment of the present invention.

Next, as illustrated in FIG. 4F, the formation of the insulating layer 111, the conductor layer 121, the insulating layer 112, and the conductor layer 12 described above with reference to FIGS. 4D and 4E is repeated until the outermost conductor layer 12 on the first surface (F1) side of the core substrate 100 is formed.

Figure 4G:
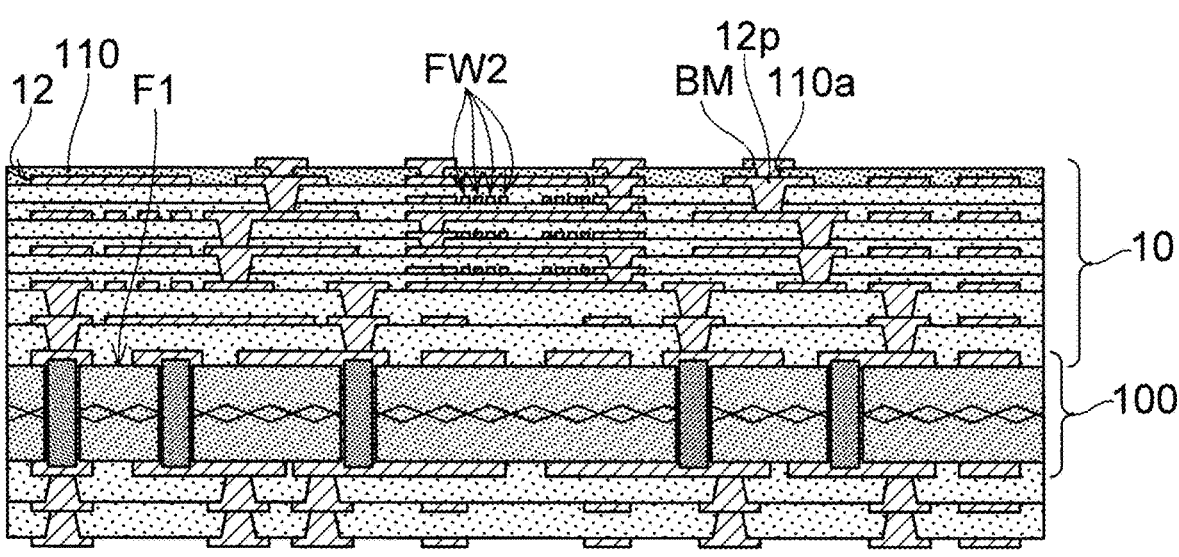
FIG. 4G is a cross-sectional view illustrating a method for manufacturing a wiring substrate according to an embodiment of the present invention.

Next, as illustrated in FIG. 4G, on the first surface (F1) side of the core substrate 100, the insulating layer 110, which is, for example, a solder resist layer, is formed on the outermost conductor layer 12. For example, a photosensitive epoxy resin film is formed by spray coating, curtain coating, or film pasting, and the openings (110a) are formed by exposure and development. The conductor pads (12p) are exposed from the openings (110a). On the conductor pads (12p) exposed from the openings (110a), the connection elements (BM) are formed, which are, for example, conductor posts that fill the openings (110a) and protrude to an upper side of the insulating layer 110.

The connection elements (BM) can be formed, for example, using a semi-additive method. It may be possible that the formation of the connection elements (BM) is performed by only electroless plating on the conductor pads (12p). It may be possible that a plating layer formed of two layers including a nickel layer and a tin layer is formed on the surfaces of the connection elements (BM). By the above processes, the formation of the first build-up part 10 is completed. Although not illustrated in FIGS. 4E-4G, the second wirings (FW2) included in the formed first build-up part 10 can be connected to via conductors that are positioned on a back side or a front side in a thickness direction of the paper sheet and penetrate the insulating layers (111, 112) so as to be electrically connected to the connection elements (bm) (see FIG. 2) forming the outermost surface of the first build-up part 10.

Figure 4H:
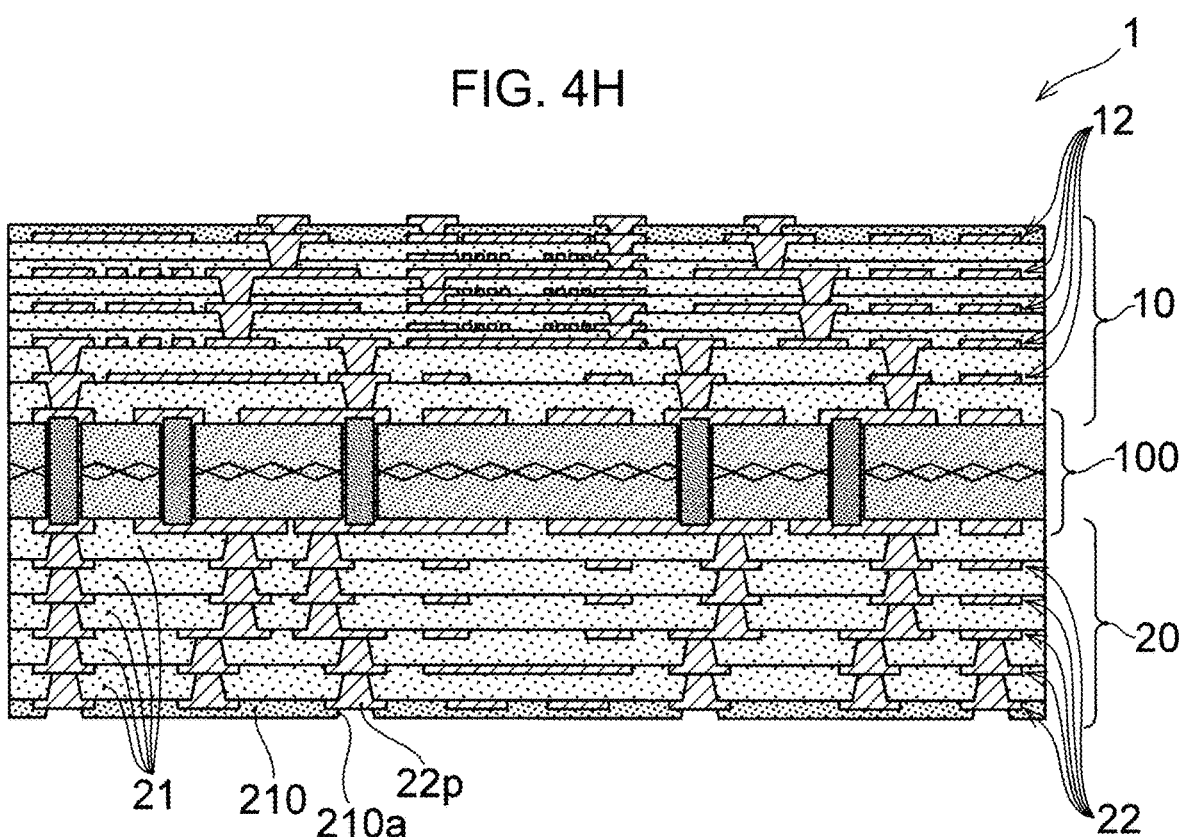
FIG. 4H is a cross-sectional view illustrating a method for manufacturing a wiring substrate according to an embodiment of the present invention.

Next, as illustrated in FIG. 4H, on the second surface (F2) side of the core substrate 100, the lamination of the insulating layer 21 and the conductor layer 22 described above is repeated a desired number of times. The insulating layer 210 exposing the conductor pads (22p) is formed on the outermost conductor layer 22 using the same method as the formation of the insulating layer 110 described above. By the above processes, the formation of the second build-up part 20 is completed, and the manufacture of the wiring substrate 1 is completed. It may be possible that the second build-up part 20 is formed such that the number of the conductor layers 22 is equal to the number of conductor layers 12 forming the first build-up part 10. Therefore, it may be possible that the first build-up part 10 and the second build-up part 20 are formed to have substantially the same dimension in the thickness direction.

The wiring substrate of the embodiment is not limited to those having the structures illustrated in the drawings and those having the structures, shapes, and materials exemplified herein. The wiring substrate of the embodiment may have at least, in the first build-up part 10, the first region (A) that includes the first wirings (FW1), and the second region (B) that includes the insulating layers (111, 112) contiguously extending from the first region (A), has smaller distances between adjacent conductor layers than those of the first region (A), and includes the second wirings (FW2) having smaller wiring widths and inter-wiring distances than those of the first wirings (FW1). For example, the first build-up part 10 of the wiring substrate can have any number of insulating layers (11, 111, 112) and any number of conductor layers (12, 121). Also, the second region (B) may be multiple separate regions in the first build-up part 10. Further, the method for manufacturing the wiring substrate is not limited to the method described with reference to the drawings, and conditions, processing order, and the like of the method can be modified as appropriate. Depending on a structure of an actually manufactured wiring substrate, some of the processes may be omitted, or other processes may be added.

Japanese Patent Application Laid-Open Publication No. 2014-225631 describes a wiring substrate that includes: a first wiring member in which insulating layers and wiring layers are symmetrically laminated on both sides of a core layer; a second wiring member that is a high-density wiring layer laminated on one side of the first wiring member; and an outermost insulating layer that is a solder resist layer laminated on the other side of the first wiring member.

In Japanese Patent Application Laid-Open Publication No. 2014-225631, to suppress warping of the wiring substrate, the thickness of the outermost insulating layer laminated on the other side of the first wiring member is set to be equal to or greater than the thickness of the second wiring member. It is thought that the dimension in the thickness direction of the wiring substrate is increased.

A wiring substrate according to an embodiment of the present invention includes: a core substrate having a first surface and a second surface on the opposite side with respect to the first surface; a first build-up part having multiple insulating layers and multiple conductor layers alternately laminated on an upper side of the first surface; and a second build-up part having multiple insulating layers and multiple conductor layers alternately laminated on an upper side of the second surface. The first build-up part includes a first region, and a second region in which a distance between adjacent conductor layers is smaller than a distance between adjacent conductor layers in the first region. The conductor layers included in the second region include second wirings of which a minimum wiring width and a minimum inter-wiring distance are respectively smaller than a minimum wiring width and a minimum inter-wiring distance of first wirings of the conductor layers included in the first region. The insulating layers included in the second region are respectively continuous with the insulating layers included in the first region.

According to an embodiment of the present invention, the wiring substrate has the first build-up part and the second build-up part, and in the first build-up part, the insulating layers included in the second region having the second wirings, which are relatively high-density wirings, are continuous with the insulating layers included in the first region. Therefore, a wiring substrate that achieves suppression of warping while suppressing an increase in dimension in a thickness direction can be provided.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:

a core substrate;

a first build-up part formed on a first surface of the core substrate and comprising a plurality of insulating layers and a plurality of conductor layers; and a second build-up part formed on a second surface of the core substate on an opposite side with respect to the first surface and comprising a plurality of insulating layers and a plurality of conductor layers, wherein the first build-up part includes a first region and a second region such that the plurality of insulating layers is extending through the first and second regions in the first build-up layer and that a number of the conductor layers in the second region is greater than a number of the conductor layers in the first region and that a distance between adjacent conductor layers in the second region is smaller than a distance between adjacent conductor layers in the first region, the conductor layers in the second region include a plurality of second wirings having a minimum wiring width and a minimum inter-wiring distance that are smaller than a minimum wiring width and a minimum inter-wiring distance of a plurality of first wirings of the conductor layers in the first region, respectively, and the insulating layers are continuous in the first region and second region.

2. The wiring substrate according to claim 1, wherein the first build-up part has an outermost surface including a first component mounting region and a second component mounting region such that the first-build-up part has a plurality of connection elements in the first component mounting region and the second component mounting region and that the connection elements in the first component mounting region and the connection elements in the second component mounting region are connected via the second wirings.

3. The wiring substrate according to claim 1, wherein the plurality of conductor layers in the second region in the first build-up part is formed such that at least one of a conductor layer adjacent to an upper side and a conductor layer adjacent to a lower side of the second wirings includes a plane layer overlapping the second wirings.

4. The wiring substrate according to claim 1, wherein the plurality of conductor layers in the first region in the first build-up part is formed such that the plurality of first wirings has the minimum wiring width of 5 μm or less and the minimum inter-wiring distance of 7 μm or less, and the plurality of conductor layers in the second region in the first build-up part is formed such that the plurality of second wirings has the minimum wiring width of 3 μm or less and the minimum inter-wiring distance of 5 μm or less.

5. The wiring substrate according to claim 1, wherein the plurality of conductor layers in the first build-up part is formed such that each of the conductor layers including the first wirings has a thickness in a range of 7 μm to 20 μm and that each of the conductor layers including the second wirings has a thickness in a range of 3 μm to 15 μm.

6. The wiring substrate according to claim 1, wherein the plurality of conductor layers in the first build-up part is formed such that each of the first wirings and second wirings has an aspect ratio in a range of 2.0 to 4.0.

7. The wiring substrate according to claim 1, wherein the first build-up part is formed such that the number of the conductor layers in the first region is equal to a number of the conductor layers in the second build-up part.

8. The wiring substrate according to claim 1, wherein the first build-up part is formed such that each of the first wirings and second wirings has a polished upper surface having an arithmetic mean roughness of 0.3 μm or less.

9. The wiring substrate according to claim 1, wherein the first build-up part is formed such that two insulating layers are interposed between adjacent conductor layers in the first region and that one insulating layer is interposed between adjacent conductor layers in the second region.

10. The wiring substrate according to claim 9, wherein the first build-up part is formed such that adjacent conductor layers in the first region are connected by via conductors penetrating two insulating layers and that adjacent conductor layers in the second region are connected by via conductors penetrating one insulating layer.

11. The wiring substrate according to claim 2, wherein the plurality of conductor layers in the second region in the first build-up part is formed such that at least one of a conductor layer adjacent to an upper side and a conductor layer adjacent to a lower side of the second wirings includes a plane layer overlapping the second wirings.

12. The wiring substrate according to claim 2, wherein the plurality of conductor layers in the first region in the first build-up part is formed such that the plurality of first wirings has the minimum wiring width of 5 μm or less and the minimum inter-wiring distance of 7 μm or less, and the plurality of conductor layers in the second region in the first build-up part is formed such that the plurality of second wirings has the minimum wiring width of 3 μm or less and the minimum inter-wiring distance of 5 μm or less.

13. The wiring substrate according to claim 2, wherein the plurality of conductor layers in the first build-up part is formed such that each of the conductor layers including the first wirings has a thickness in a range of 7 μm to 20 μm and that each of the conductor layers including the second wirings has a thickness in a range of 3 μm to 15 μm.

14. The wiring substrate according to claim 2, wherein the plurality of conductor layers in the first build-up part is formed such that each of the first wirings and second wirings has an aspect ratio in a range of 2.0 to 4.0.

15. The wiring substrate according to claim 2, wherein the first build-up part is formed such that the number of the conductor layers in the first region is equal to a number of the conductor layers in the second build-up part.

16. The wiring substrate according to claim 2, wherein the first build-up part is formed such that each of the first wirings and second wirings has a polished upper surface having an arithmetic mean roughness of 0.3 μm or less.

17. The wiring substrate according to claim 2, wherein the first build-up part is formed such that two insulating layers are interposed between adjacent conductor layers in the first region and that one insulating layer is interposed between adjacent conductor layers in the second region.

18. The wiring substrate according to claim 17, wherein the first build-up part is formed such that adjacent conductor layers in the first region are connected by via conductors penetrating two insulating layers and that adjacent conductor layers in the second region are connected by via conductors penetrating one insulating layer.

19. The wiring substrate according to claim 3, wherein the plurality of conductor layers in the first region in the first build-up part is formed such that the plurality of first wirings has the minimum wiring width of 5 μm or less and the minimum inter-wiring distance of 7 μm or less, and the plurality of conductor layers in the second region in the first build-up part is formed such that the plurality of second wirings has the minimum wiring width of 3 μm or less and the minimum inter-wiring distance of 5 μm or less.

20. The wiring substrate according to claim 3, wherein the plurality of conductor layers in the first build-up part is formed such that each of the conductor layers including the first wirings has a thickness in a range of 7 μm to 20 μm and that each of the conductor layers including the second wirings has a thickness in a range of 3 μm to 15 μm.

\* \* \* \* \*